(12) United States Patent
Kim (10) Patent No.: US 8,829,596 B2
(45) Date of Patent: Sep. 9, 2014

(54) NONVOLATILE MEMORY DEVICE AND METHOD OF MANUFACTURING THE SAME

(75) Inventor: Jong Man Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,085

(22) Filed: Aug. 31, 2012

(65) Prior Publication Data
US 2013/0207177 A1 Aug. 15, 2013

(30) Foreign Application Priority Data
Feb. 13, 2012 (KR) ......................... 10-2012-0014235

(51) Int. Cl.
*H01L 29/792* (2006.01)
(52) U.S. Cl.
USPC ........... 257/324; 438/591; 438/593; 438/594; 438/261; 438/421
(58) Field of Classification Search
USPC ....... 257/324, 316, E29.3, E21.209, 319, 326
See application file for complete search history.

(56) References Cited

U.S. PATENT DOCUMENTS

| 7,387,939 B2 | 6/2008 | Manning | |
|---|---|---|---|
| 2012/0068245 A1* | 3/2012 | Kim et al. | 257/315 |
| 2012/0132985 A1* | 5/2012 | Kai et al. | 257/326 |

FOREIGN PATENT DOCUMENTS

KR 1020110121360 A 11/2011

* cited by examiner

*Primary Examiner* — Chuong A Luu
*Assistant Examiner* — Rodolfo Fortich
(74) *Attorney, Agent, or Firm* — William Park & Associates Patent Ltd.

(57) ABSTRACT

The nonvolatile memory device includes a semiconductor layer including trenches formed in a first direction, isolation layers filling the trenches, and active regions divided by the isolation layer, first insulating patterns formed on the semiconductor substrate in a second direction crossing the first direction, charge storage layer patterns formed over the respective active regions between the first insulating patterns, and second insulating patterns formed on the isolation layers between the charge storage layer patterns.

17 Claims, 13 Drawing Sheets

NONVOLATILE MEMORY DEVICE AND METHOD OF MANUFACTURING THE SAME

CROSS-REFERENCE TO RELATED APPLICATIONS

Priority to Korean patent application number 10-2012-0014235, filed on Feb. 13, 2012, the entire disclosure of which is incorporated by reference herein, is claimed.

BACKGROUND

The present invention relates generally to a nonvolatile memory device and a method of manufacturing the nonvolatile memory device, and more particularly to a NAND flash memory device and a method of manufacturing the NAND flash memory device.

According to higher integration demands of a nonvolatile memory device and the decrease in pitch between memory cells, the defect rate when forming a pattern on the nonvolatile memory device has been increasing. Since it is advantageous to create highly integrated NAND flash memory devices, defects are easily generated when forming gate patterns.

A method of forming the gate pattern of the NAND flash memory device will be described below. First, a tunnel insulating layer and a charge storage layer are deposited on a semiconductor substrate. The charge storage layer, the tunnel insulating layer, and the semiconductor substrate are etched using an isolation hard mask patterns as etching barriers, forming trenches in a first direction in the semiconductor substrate. The tunnel insulating layer patterns and the first charge storage layer patterns remain on active regions of the semiconductor substrate divided by the trenches. The trenches are filled with an insulating material, to form an isolation layers.

The charge storing layer and a control gate layer may be formed in subsequent processes by increasing the facing area between the charge storing layer and the control gate layer. In order to improve the couple rate between the two layers, the height of the isolation layer is formed to be less than that of the first charge storage layer pattern through the etching process. Accordingly, the Effective Field oxide Height (EFH) of the isolation layer is determined and a part of the side wall of the first charge storage layer pattern is exposed.

A dielectric layer is formed along a surface of the first charge storage layer pattern of which a part of the side wall is exposed, and a surface of the isolation layer, and the control gate layer is subsequently formed on the dielectric layer. The control gate layer is formed with a thickness sufficient to fill a space between the first charge storage layer patterns. Subsequently, gate hard mask patterns in a second direction crossing the first direction are formed over the control gate layer. The control gate layer, the dielectric layer and the first charge storage layer patterns are etched using the gate hard mask patterns as etching barriers. Accordingly, the control gate layer patterns are formed as lines in the second direction, and each of the first charge storage layer patterns are divided into a plurality of second charge storage layer patterns at each of the active regions. The charge storage layer remains in a crossing part of the control gate layer pattern and the active region.

In a process of patterning the control gate layer, the dielectric layer, and the first charge storage layer patterns, the dielectric layer formed on the side wall of the first charge storage layer pattern is not completely removed and remains to form a fence. The fence of the dielectric layer blocks a part of the charge storage layer to be etched, so that an unnecessary part of the charge storage layer may not be removed. The second charge storage layer patterns are not isolated, but are connected through a remaining partial region of the charge storage layer through the fence of the dielectric layer on the active region, thereby causing failure of the device. During a process of injecting impurities in order to form a junction region, the impurities are not injected to a part of the active region adjacent to the partial region of the charge storage layer left due to the fence of the dielectric layer, thereby generating a disturbance during the operation of the device.

BRIEF SUMMARY

In order to address the issues above, the present disclosure is a nonvolatile memory device including spaced charge storage layer patterns formed on an active region and an insulating pattern formed between the charge storage layer patterns.

An embodiment of the present invention provides a nonvolatile memory device including: a semiconductor layer including trenches formed in a first direction, isolation layers filling the trenches, and active regions divided by the isolation layers; first insulating patterns formed on the semiconductor substrate in a second direction crossing the first direction; charge storage layer patterns formed over the respective active regions between the first insulating patterns; and second insulating patterns formed on the isolation layers between the charge storage layer patterns.

Another embodiment of the present invention provides a method of manufacturing a nonvolatile memory device including: forming trenches in a semiconductor substrate in a first direction; filling the trenches with isolation layers to define active regions divided by the isolation layers; forming first insulating patterns on the semiconductor substrate in a second direction crossing the first direction; forming charge storage layer patterns over the respective active regions between the first insulating patterns; and forming second insulating patterns on the isolation layers between the charge storage layer patterns.

DETAILED DESCRIPTION

Hereinafter, various embodiments of the present invention will be described with reference to the accompanying drawings in detail. However, the present invention is not limited to embodiments disclosed below and may be implemented in various forms. The embodiments are provided only for illustrative purposes and for full understanding of the scope of the present invention by those skilled in the art.

Figure 1A:
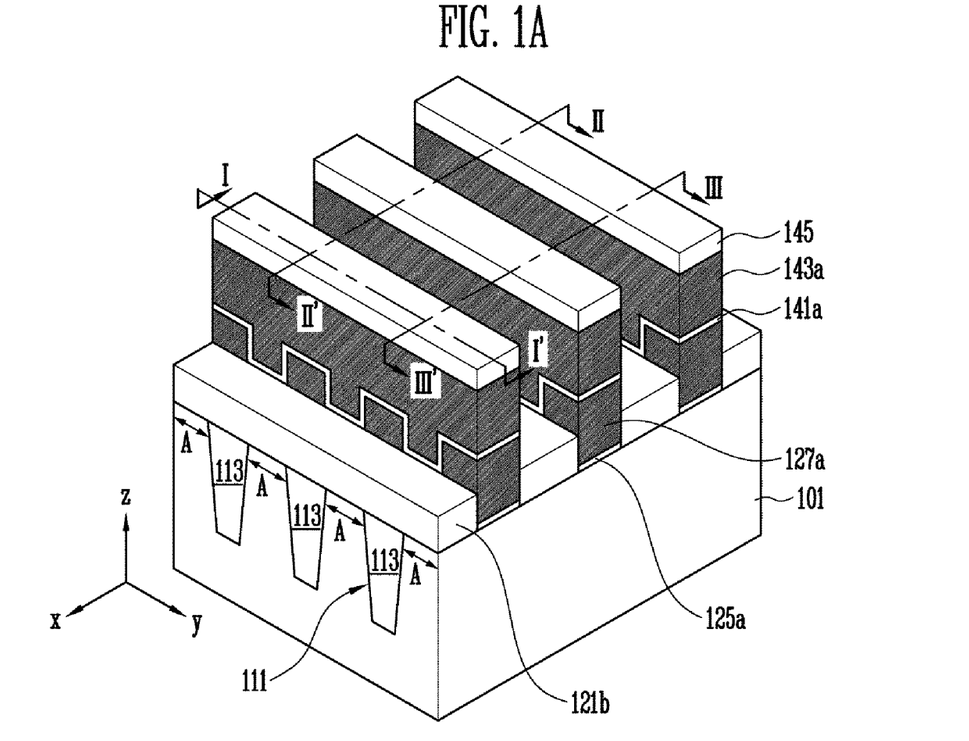
FIGS. 1A to 1D illustrate a perspective view of a nonvolatile memory device and cross-sectional views of the nonvolatile memory device taken along lines "I-I'", "II-II'", and "III-III'" of the perspective view according to an embodiment of the present invention.
Figure 1B:
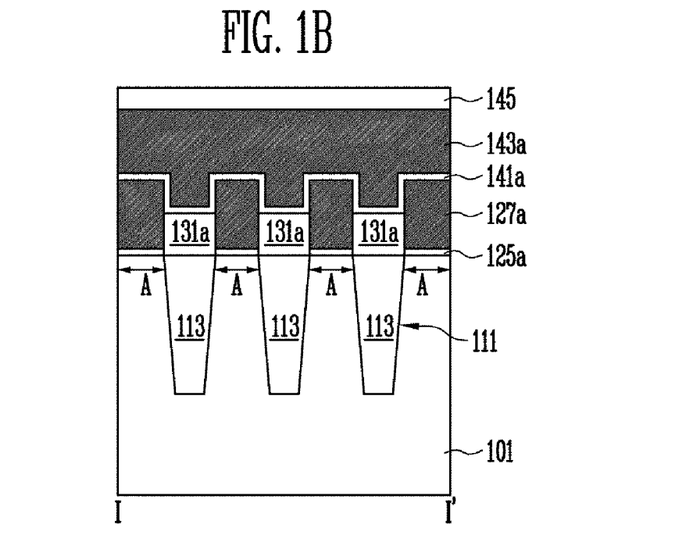
Figure 1C:
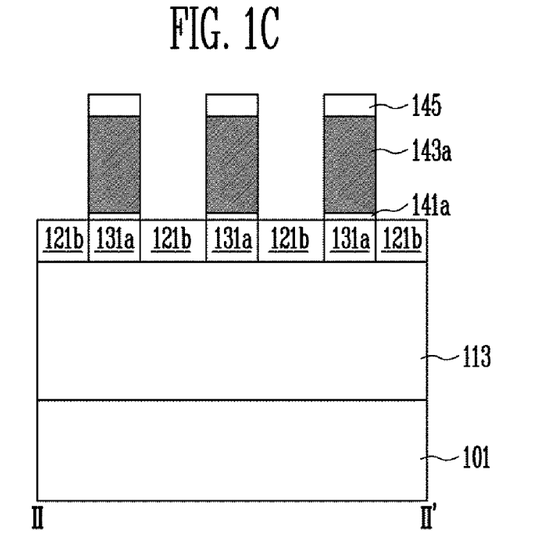
Figure 1D:
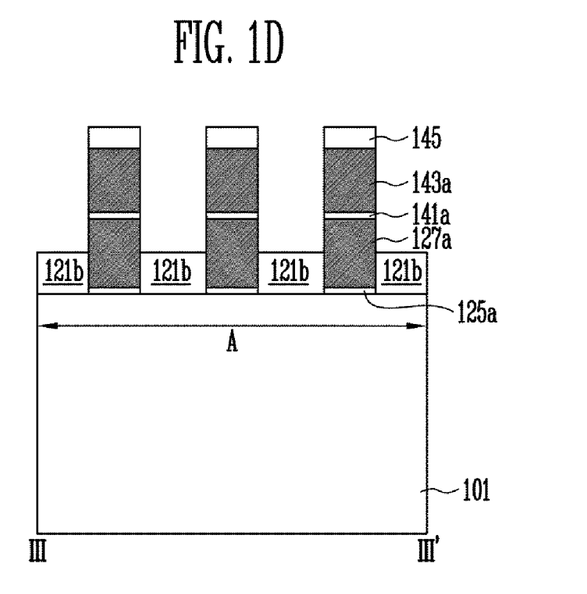

FIGS. 1A to 1D are perspective views and cross-sectional views illustrating a nonvolatile memory device according to an embodiment of the present invention. The cross-sectional views illustrated in FIGS. 1B to 1D are the views taken along lines "I-I'", "II-II'", and "III-III'" illustrated in FIG. 1A.

Referring to FIGS. 1A to 1D, the nonvolatile memory device according to an embodiment of the present invention includes a semiconductor substrate 101 having active regions A isolated by isolation layers 113, and gate patterns formed on the semiconductor substrate 101. The isolation layers 113 fill the trenches 111 formed along the x-axis direction (hereinafter, referred to as a "first direction") in a xyz coordinate system. The active regions A are to be defined in the first direction. The active regions A in a memory array region are divided by the isolation layers 113.

Each of the gate patterns are formed as a structure in which a tunnel insulating layer 125a, a charge storage layer pattern 127a, a dielectric layer 141a, and a control gate pattern 143a are stacked. A mask pattern 145 may be further deposited on the control gate pattern 143a.

The tunnel insulating layer 125a may be formed of a silicon oxide ($SiO_2$) layer and the charge storage layer pattern 127a may be formed of a silicon layer. The tunnel insulating layer 125a and the charge storage layer pattern 127a may be formed on the active region A between first insulating patterns 121b. The first insulating patterns 121b are formed over the semiconductor substrate 101 along the y-axis direction (hereinafter, referred to as a "second direction" crossing the first direction) in a xyz coordinate system.

Second insulating patterns 131a are further formed on the isolation layers 113 between the charge storage layer patterns 127a which are adjacent to each other in the second direction. Accordingly, the isolation layers 113 of the memory array region are blocked by the first and second insulating patterns 121b and 131a.

In order to minimize the generation of void or seam in the trench 111 caused by an increase in the aspect ratio of the trench 111 due to high-integration of the nonvolatile memory device, the isolation layer 113 may be formed by hardening a Spin On Dielectric (SOD) layer having high flowability.

The first and second insulating patterns 121b and 131a blocking the isolation layers 113 are formed of an insulating material having a higher density than that of the isolation layer 113, such as High Density Plasma (HDP) oxide or Tetra Ethly OrthoSilicate (TEOS) oxide, which may protect the isolation layer 113 formed of the SOD layer having a lower density. The first and second insulating patterns 121b and 131a may also be uniformly etched compared to the isolation layer 113. Accordingly, the present invention may adjust the Effective Field oxide Height (EFH) by etching the first and second insulating patterns 121b and 131a, which may be uniformly formed as compared with the case when the EFH is adjusted by etching the isolation layer 113.

In order to improve the coupling rate between the charge storage layer pattern 127a and the control gate pattern 143a by increasing the facing area between the charge storage layer pattern 127a and the control gate pattern 143a, heights of the first and second insulating patterns 121b and 131a may need to be decreased compared to that of the charge storage layer pattern 127a. An upper portion of the space between the charge storage layer patterns 127a is left opened by the first and second insulating patterns 121b and 131a.

The dielectric layer 141a is formed along surfaces of the first and second insulating patterns 121b and 131a and surfaces of the charge storage layer patterns 127a, and may be formed as a structure in which an oxide layer, a nitride layer, and an oxide layer are stacked. The thickness of the dielectric layer 141a is controlled such that the upper portion of the space between the charge storage layer patterns 127a is not filled.

The control gate pattern 143a is formed with a thickness sufficient to fill the space between the charge storage layer patterns 127a in the second direction, and also overlaps the charge storage layer patterns 127a arranged in the second direction since it is formed in a line along the second direction. The dielectric layer 141a under the control gate pattern 143a may also be patterned in the same form as that of the control gate pattern 143a. The control gate pattern 143a may be formed of a silicon layer, a metal layer, a metal silicide layer, or a single layer of a metal nitride layer, or a stacked layer including at least two material layers among a silicon layer, a metal layer, a metal silicide layer, and a single layer of a metal nitride layer.

As described above, the nonvolatile memory device according to various embodiments of the present invention may be formed in a manner where the charge storage layer patterns 127 are separated in the first and second directions by the first and second insulating patterns 121b and 131a. The uniformity of the EFH may be improved by adjusting the EFH through the first and second insulating patterns 121b and 131a.

FIGS. 2A to 2J are plan views and cross-sectional views illustrating a method of manufacturing a nonvolatile memory device according to an embodiment of the present invention. The cross-sectional views of FIGS. 2A to 2J are views taken along lines "I-I'", "II-II'", and "III-III'" of the plan views.

Figure 2A:
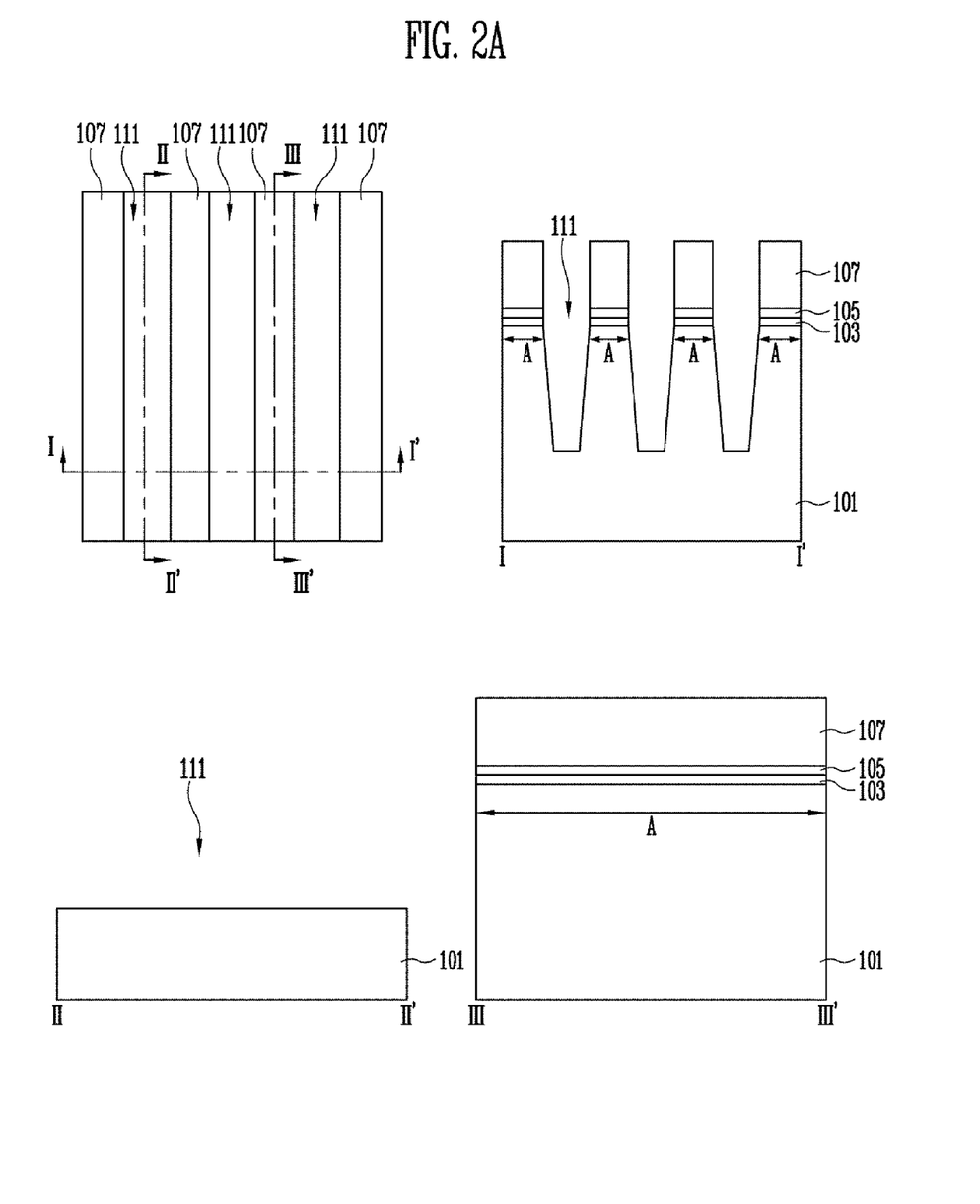
FIGS. 2A to 2J are plan views illustrating a method of manufacturing a nonvolatile memory device and cross-sectional views illustrating the method taken along lines "I-I'", "II-II'", and "III-III'" of the plan views according to an embodiment of the present invention.

Referring to FIG. 2A, the trenches 111 along the first direction are formed in the semiconductor substrate 101. A method of forming the trenches will be specifically described below.

A buffer oxide layer 103 is formed on the semiconductor substrate 101 in which a well (not shown) is formed. Ions for adjusting a threshold voltage are injected into a predetermined depth in the semiconductor substrate 101 on which the buffer oxide layer 103 is formed. An etching stopping layer 105 and first mask patterns 107 are sequentially formed on the buffer oxide layer 103.

The etching stopping layer 105, which is a layer functioning as a planarization stopping layer in the a subsequent planarization process, may be formed of a nitride layer. The first mask patterns 107, which may be formed of an oxide layer, are patterns allowing regions in which the trenches are to be formed to be opened, functioning as etching barriers in the subsequent etching process for forming the trenches, and may be formed in a line pattern in the first direction.

The etching stopping layer 105, the buffer oxide layer 103, and the semiconductor substrate 101 exposed by the first mask patterns 107 are etched using the first mask patterns 107 as the etching barriers, to form the trenches 111 having the predetermined depth in the semiconductor substrate 101. Regions in which the trenches are not formed, i.e. regions under the first mask patterns 107, are defined as active regions A of the semiconductor substrate 101. The active regions A are formed in the first direction identical to the first mask patterns 107.

Figure 2B:
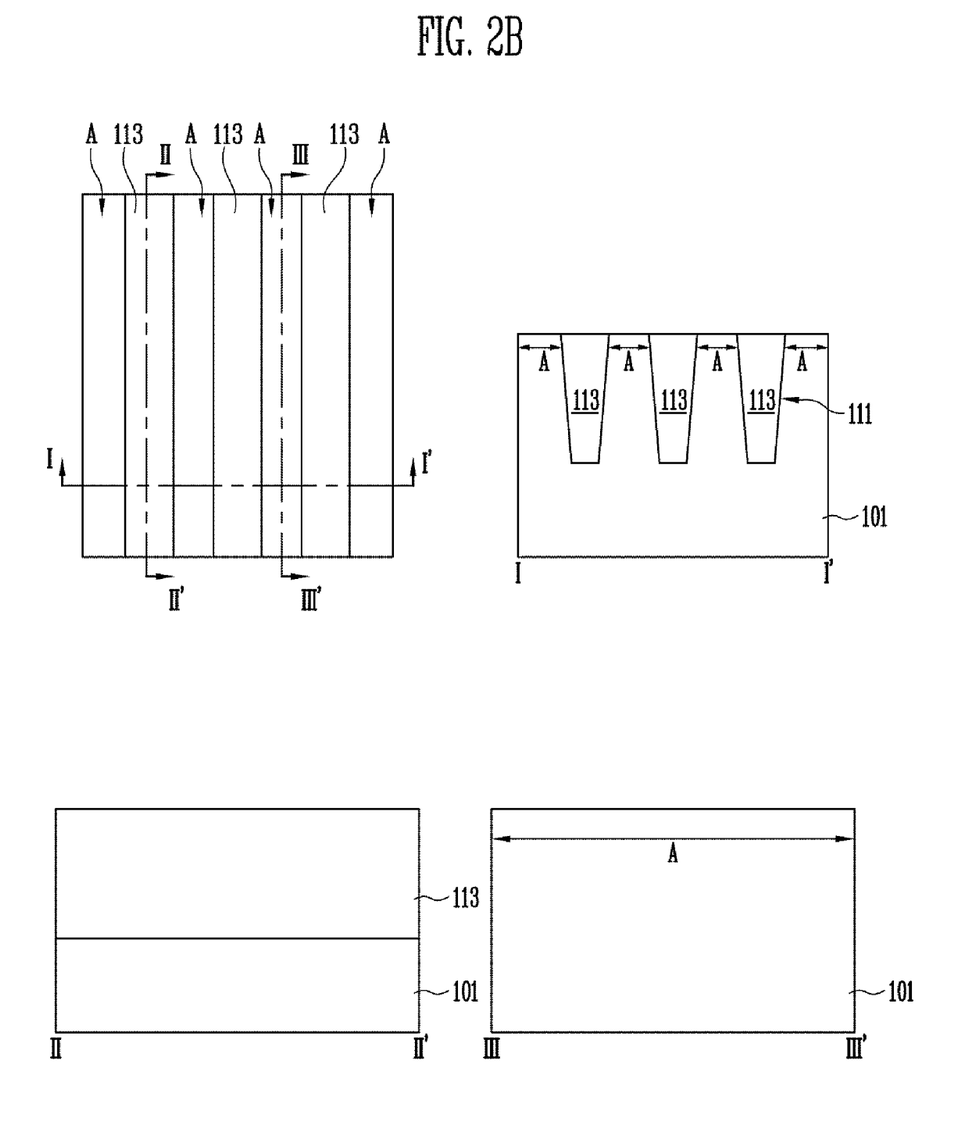

Referring to FIG. 2B, the trenches 111 formed in the semiconductor substrate 101 is filled with the isolation layers 113. A method of forming the isolation layers 113 will be specifically described below.

An insulating material is formed on an entire structure with a thickness sufficient to fill the trenches 111. The insulating material may be formed by depositing an SOD layer capable of filling the narrow and deep trenches 111, and then hardening the SOD layer through an annealing process. The generation of void and seam within the trenches 111 may be reduced since the SOD layer has high flowability. In an embodiment of the present invention, the trenches 111 are filled with the insulating material in a state where the charge storage layer is not further stacked on the active regions A, thereby further minimizing the generation of the void and seam.

A planarization process, such as with a Chemical Mechanical Polishing (CMP) is performed until the etching stopping layer 105 is exposed. Through the planarization process, the first mask patterns 107 may be removed. Then, the etching stopping layer 105 and the buffer oxide layer 103 are removed. Accordingly, the isolation layers 113 are formed within the trenches 111 to thus insulate the active regions A of the semiconductor substrate 101.

Figure 2C:
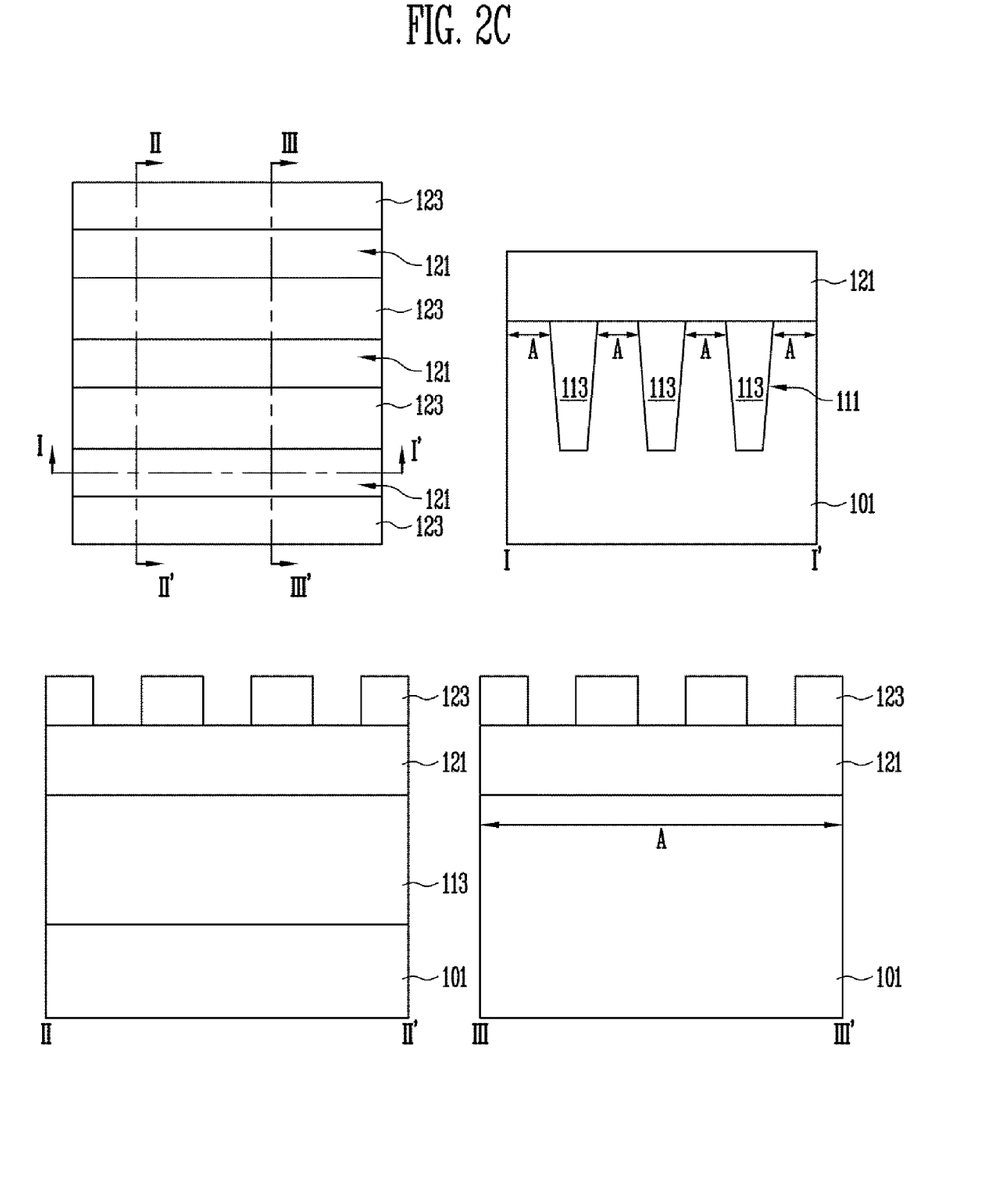

Referring to FIG. 2C, a first insulating layer 121 is formed on the semiconductor substrate 101 including the active regions A divided by the isolation layers 113. Second mask patterns 123 are formed on the first insulating layer 121. Each of the second mask patterns 123 are formed in the form of a line in the second direction, so that the regions in which the charge storage layer patterns are to be formed and parts of the isolation layers 113 are opened. The first insulating layer 121 may be formed of an HDP oxide layer or a TEOS oxide layer having a higher density than that of the isolation layers 113.

Figure 2D:
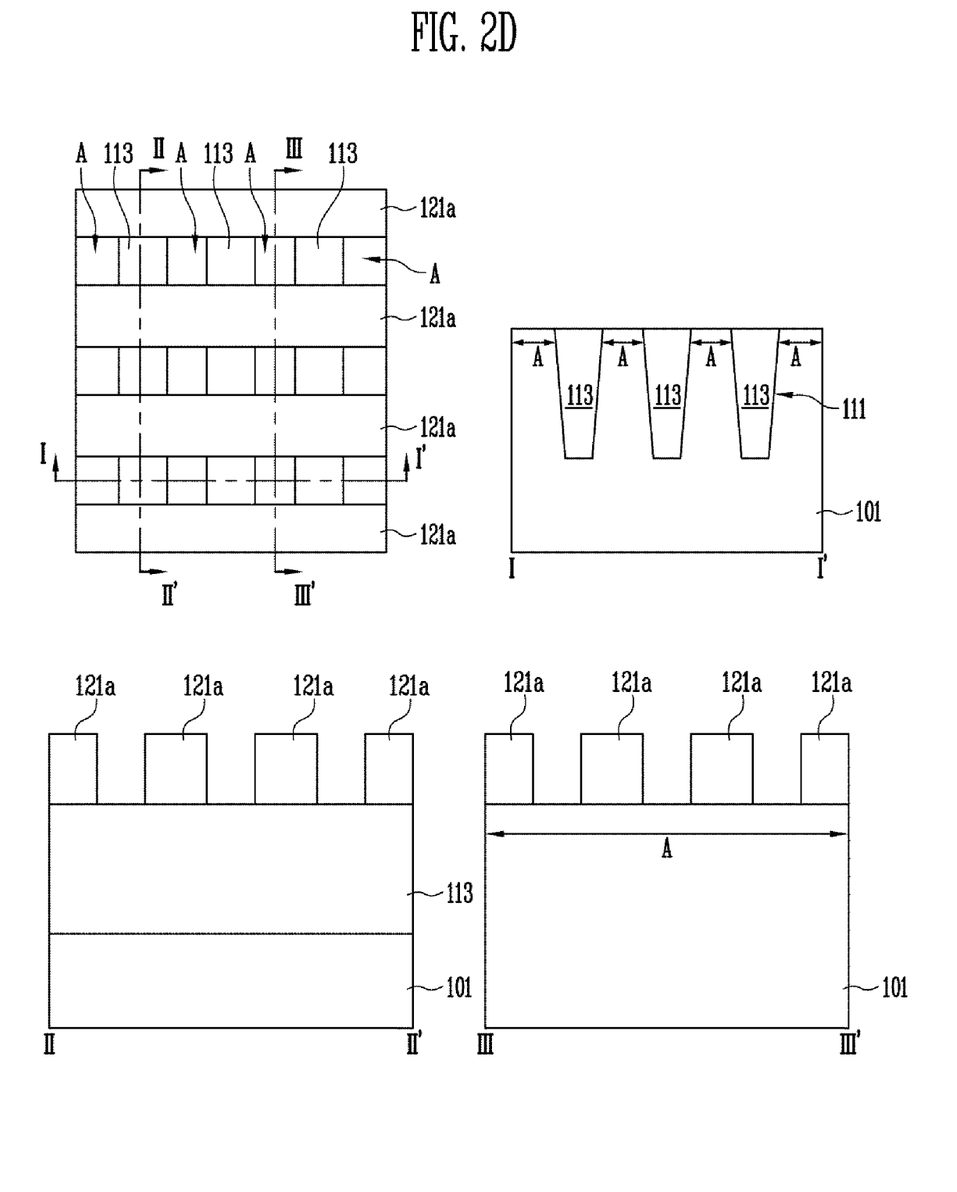

Referring to FIG. 2D, first insulating patterns 121a are formed by etching the first insulating layer 121 opened by the second mask patterns 123. The regions in which the charge storage layer patterns are to be formed and the parts of the isolation layers 113 are opened between the first insulating patterns 121a. Each of the first insulating patterns 121a is formed in a form of a line along the second direction identical to the second mask pattern 123.

After the first insulating patterns 121a are formed, the second mask patterns 123 are removed.

Figure 2E:
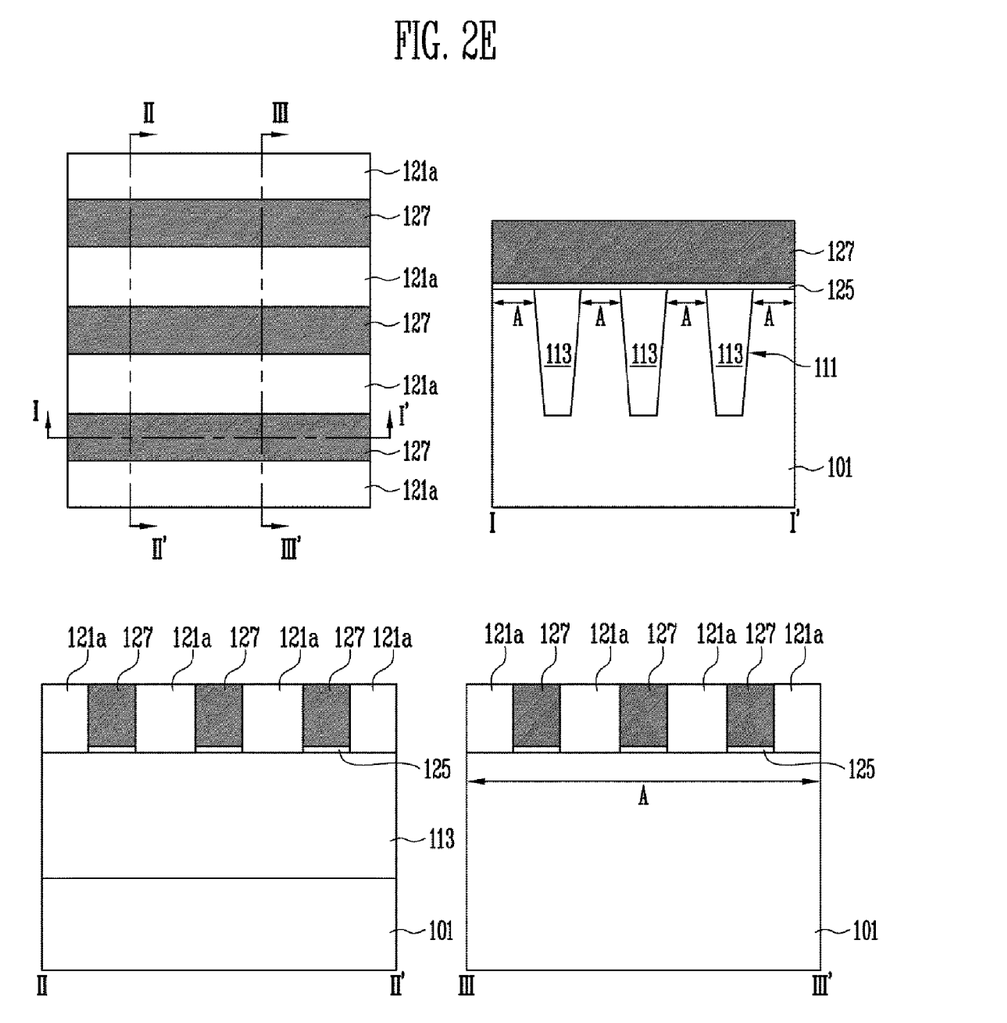

Referring to FIG. 2E, a tunnel insulating layer 125 and a charge storage layer 127 are sequentially formed on the active regions A and on the isolation layers 113 between the first insulating patterns 121a adjacent in the first direction.

The tunnel insulating layer 125 may be a silicon oxide layer formed by oxidizing the semiconductor substrate 101 or may be formed through an oxide layer deposition process. The charge storage layer 127 may be formed by forming an silicon layer with a thickness sufficient to fill the space between the first insulating patterns 121a on the entire structure in which the tunnel insulating layer 125 is formed, and then planarizing the silicon layer through the CPM, or the like, until the first insulating layer patterns 121a are exposed.

Figure 2F:
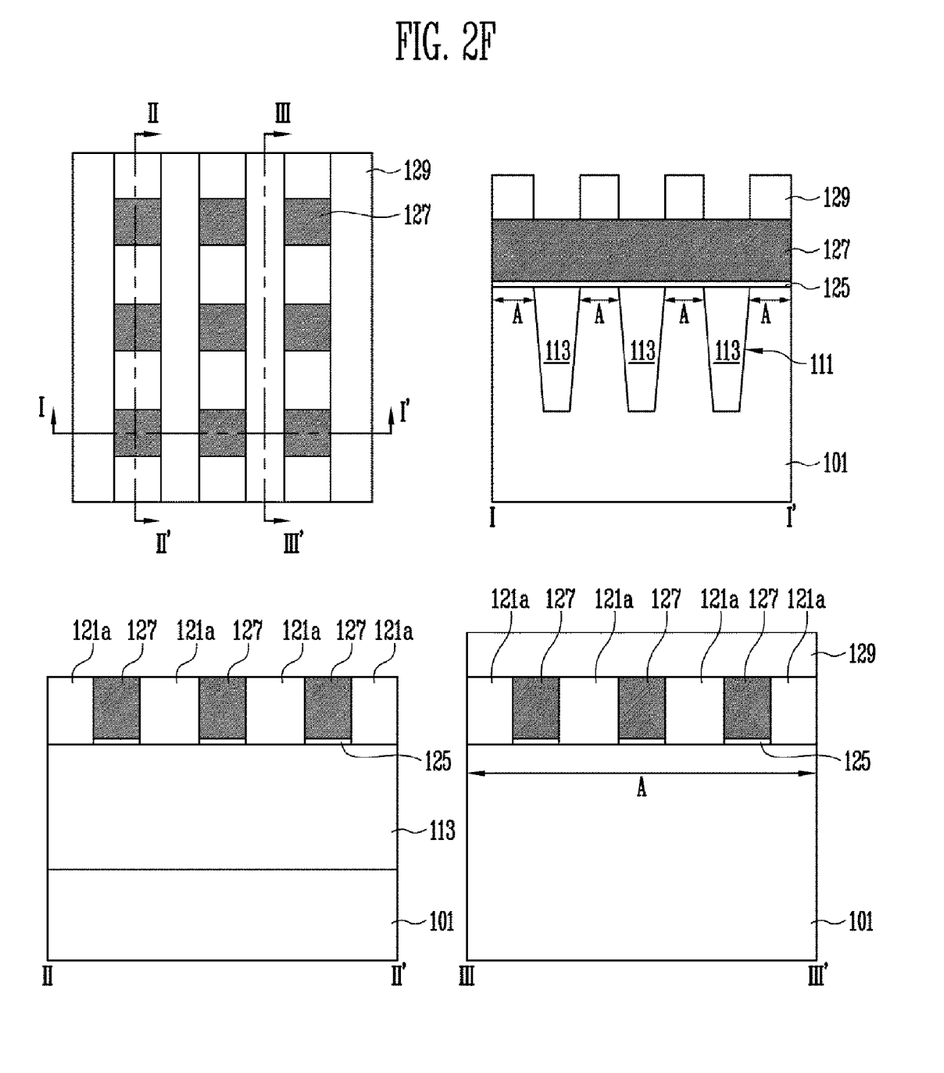

Referring to FIG. 2F, third mask patterns 129 are formed on the entire structure in which the charge storage layer 127 is formed. The third mask patterns 129 are formed in patterns by which unnecessary regions of the charge storage layer 127 are opened. Particularly, the third mask patterns 129 may be formed so as to block the charge storage layer 127 on the active regions A and expose the charge storage layer 127 on the isolation layers 113, and may be formed in a line along the first direction identically to the active regions A.

Figure 2G:
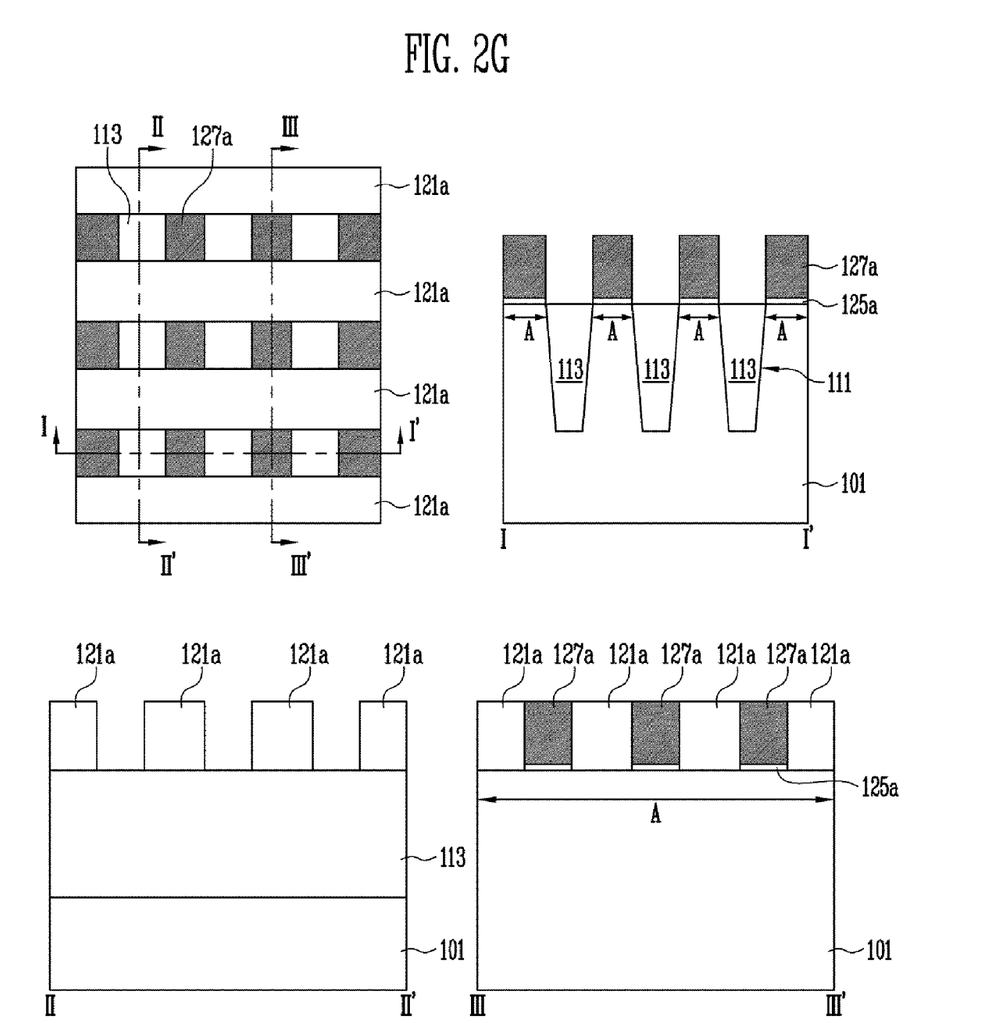

Referring to FIG. 2G, the charge storage layer patterns 127a are formed by etching the charge storage layer 127 exposed by the third mask patterns 129. The charge storage layer patterns 127a are formed on the active regions A and isolated in the first and second directions in a matrix form including a plurality of columns and a plurality of rows. After the charge storage layer 127 is etched, the tunnel insulating layer 127 exposed by the third mask patterns 129 is further etched, so that the remaining tunnel insulating layer 125a may be formed in the same form as the charge storage layer patterns 127a.

After the charge storage layer patterns 127a are formed, the third mask patterns 129 are removed.

Figure 2H:
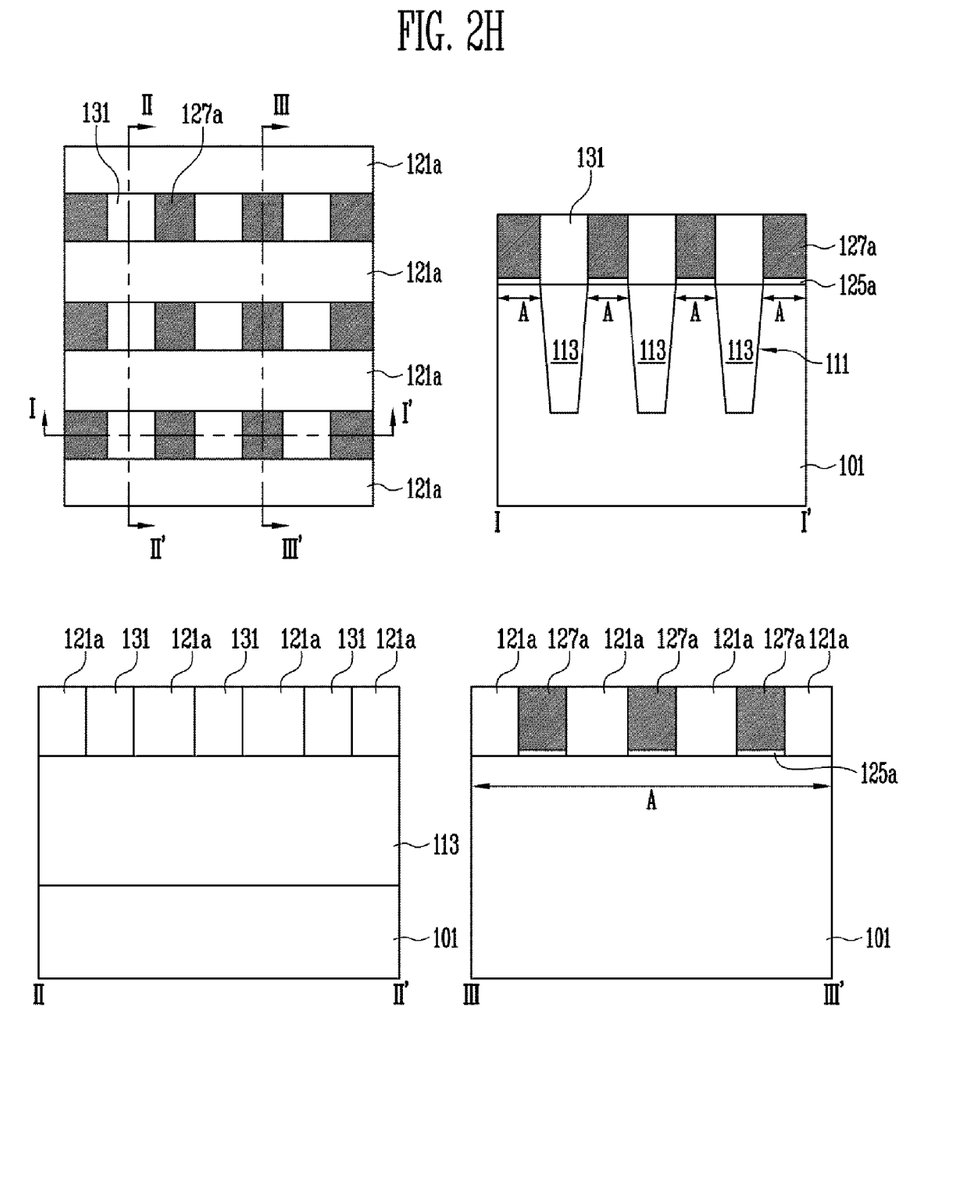

Referring to FIG. 2H, second insulating patterns 131 filling the spaces between the charge storage layer patterns 127a adjacent in the second direction are formed on the isolation layers 113 and formed of the same material as that of the first insulating patterns 121a. The second insulating patterns 131 may be formed with an isolating material having a higher density than that of the isolation layer 113, and may be formed, for example, of an HDP oxide layer and a TEOS oxide layer.

After the second insulating patterns 131 are formed, the isolation layers 113 are blocked by the first and second insulating patterns 121a and 131, and the spaces between the charge storage layer patterns 127a isolated in the first and second directions may be insulated by the first and second insulating patterns 121a and 131.

Figure 2I:
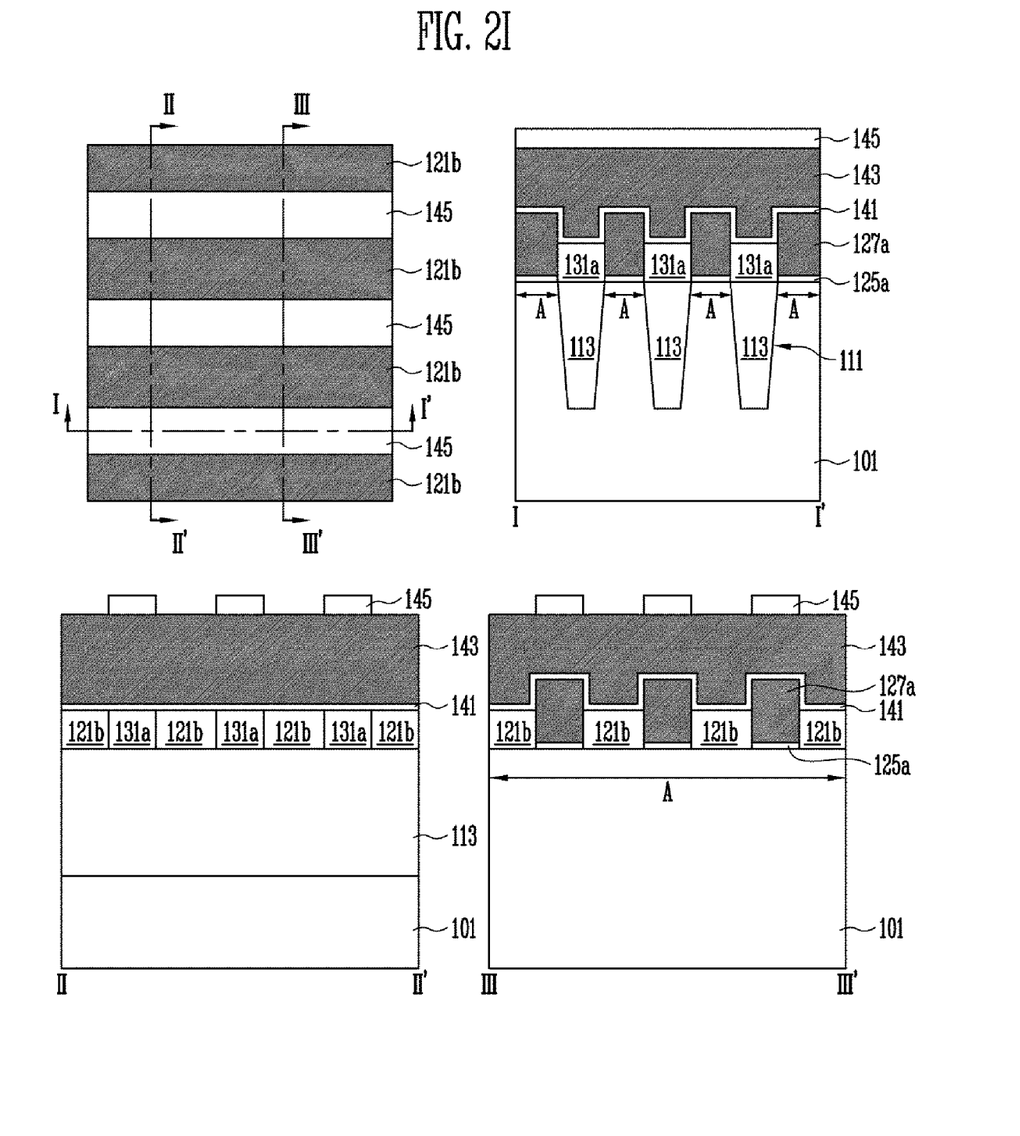

Referring to FIG. 2I, the first and second insulating patterns 121a and 131 are partially etched such that heights of the first and second insulating patterns 121b and 131a are smaller than those of the charge storage layer patterns 127a. The heights of the first and second insulating patterns 121b and 131a are adjusted by the EFH, and the upper parts of the spaces between the charge storage layer patterns 127a are opened at a predetermined depth.

As described above, the uniformity of the EFH may be improved by adjusting the EFH through the etching of the first and second insulating patterns 121a and 131 having a higher density than that of the isolation layer 113.

A dielectric layer 141 is formed along the surfaces of the first and second insulating patterns 121b and 131a and the surfaces of the charge storage layer patterns 127a. The thickness is controlled such that the spaces between the charge storage layer patterns 127a opened by the first and second insulating patterns 121b and 131a are not filled by the dielectric layer 141.

A control gate layer 143 with a thickness sufficient to fill the spaces between the charge storage layer patterns 127a opened by the first and second insulating patterns 121b and 131a is formed on the dielectric layer 141, and fourth mask patterns 145 are formed on the control gate layer 143.

Each of the fourth mask patterns 145 are patterns to define a region in which the control gate pattern is to be formed in a line along the second direction. Each of the fourth mask patterns 145 are formed so as to block the charge storage layer patterns 127a and the second insulating patterns 131a arranged in a line along the second direction.

Figure 2J:
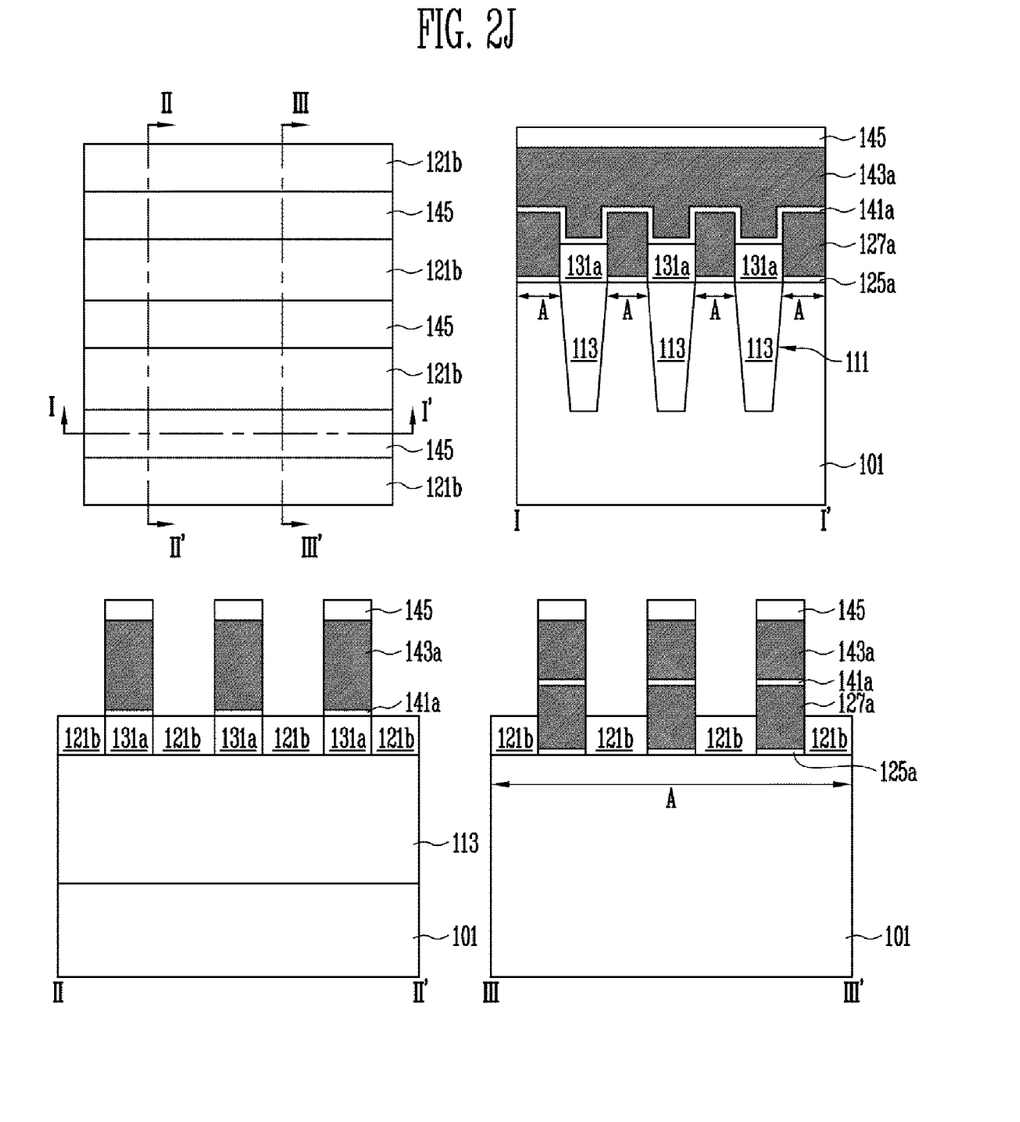

Referring to FIG. 2J, the control gate patterns 143a are formed by etching the control gate layer 143 exposed by the fourth mask patterns 145. The control gate patterns 143a are formed in the same form as that of the fourth mask patterns 145. Each of the control gate patterns 143a are formed in a line along the second direction, and is formed while overlapping the charge storage layer patterns 127a and the second insulating patterns 131a arranged in a line along the second direction.

After the control gate layer 143 is etched, the dielectric layer 141 exposed by the fourth mask patterns 145 is further etched, so that the remaining dielectric layer 141a may be formed in the same form as that of the control gate patterns 143a.

In an embodiment of the present invention, after the unnecessary region of the charge storage layer 127 is removed and the charge storage layer patterns 127a are completed, the dielectric layer 141a is formed, so that it is not necessary to further perform a process of removing the unnecessary region of the charge storage layer 127 after forming the dielectric layer 141a. In an embodiment of the present invention, a phenomenon of the non-isolation of the charge storage layer patterns 127a due to the fence of the dielectric layer and a phenomenon of the non-injection of the impurities into the junction region may be improved, thereby securing reliability and yield of the nonvolatile memory device.

Figure 3:
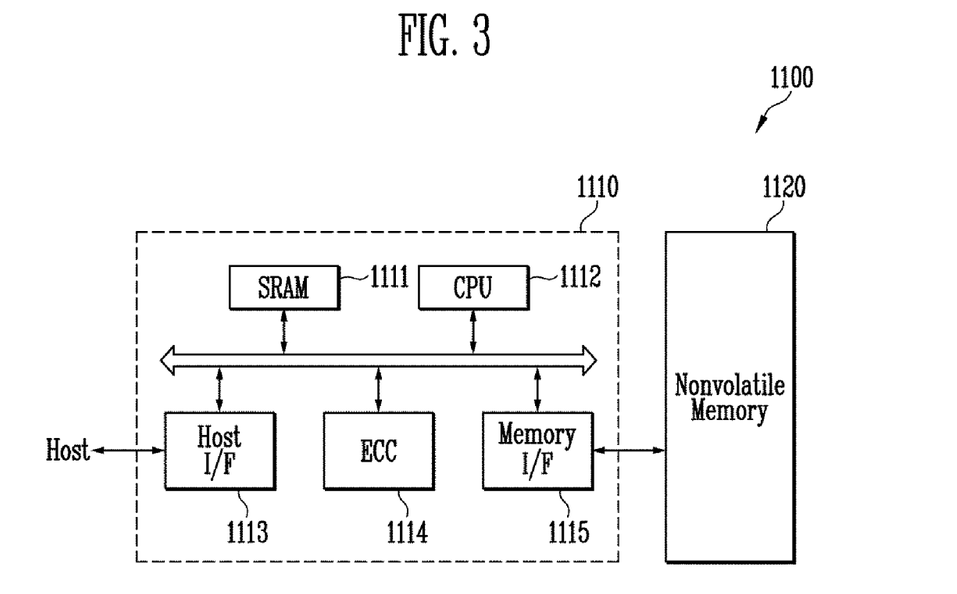
FIG. 3 is a diagram illustrating a memory system according to an embodiment of the present invention.

FIG. 3 is a diagram illustrating a memory system according to an embodiment of the present invention.

Referring to FIG. 3, the memory system 1100 according to an embodiment of the present invention includes a nonvolatile memory device 1120 and a memory controller 1110.

The nonvolatile memory device 1120 includes the nonvolatile memory device described in the embodiments described with reference to FIGS. 1 to 2J, and may include a multi-chip package configured with a plurality of flash memory chips.

The memory controller 1110 is configured so as to control the nonvolatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange with the memory controller 1110, and and the host interface 1113 includes a data exchange protocol of a host connected with the memory system 1100. The ECC 1114 detects and corrects an error included in a data read from the nonvolatile memory device 1120, and the memory interface 1115 interfaces with the nonvolatile memory device 1120. In addition, the memory controller 1110 may further include an RCM, etc., for storing code data for interfacing with the host.

As such, the memory system 1100 having the aforementioned construction may be a memory card or a Solid State Disk (SSD) in which the nonvolatile memory device 1120 is combined with the controller 1110. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A nonvolatile memory device comprising:
    a semiconductor layer including trenches, isolation layers filling the trenches, and active regions divided by the isolation layers;
    first insulating patterns formed on the semiconductor substrate to cross the active regions and the isolation layers; and
    charge storage layer patterns and second insulating patterns alternately arranged within respective spaces interposed between the first insulating patterns;
    wherein the charge storage layer patterns are formed over the respective active regions within the spaces and second insulating patterns are formed on the isolation layers within the spaces.

2. The nonvolatile memory device as claimed in claim 1, further comprising:
    a dielectric layer formed along surfaces of the first and second insulating patterns and the charge storage layer patterns; and
    a control gate pattern formed on the dielectric layer to overlap the charge storage layer patterns, and formed to cross the active regions and the isolation layers.

3. The nonvolatile memory device as claimed in claim 1, wherein the first and second insulating patterns are formed of an insulating material having a higher density than that of the isolation layers.

4. The nonvolatile memory device as claimed in claim 1, wherein the first and second insulating patterns are formed of a High density Plasma (HDP) oxide layer or a TetraEthyl OrthoSilicate (TEOS) oxide layer.

5. The nonvolatile memory device as claimed in claim 1, wherein the isolation layers are formed of a Spin on Dielectric (SOD) layer.

6. The nonvolatile memory device as claimed in claim 1, wherein the first and second insulating patterns are formed to have a height less than those of the charge storage layer patterns.

7. The nonvolatile memory device as claimed in claim 2, wherein the dielectric layer is formed of oxide and nitride.

8. The nonvolatile memory device as claimed in claim 2, wherein the control gate pattern is formed of silicon, metal, and metal silicide.

9. A method of manufacturing a nonvolatile memory device comprising:
    forming trenches in a semiconductor substrate;
    filling the trenches with isolation layers to define active regions divided by the isolation layers;
    forming first insulating patterns on the semiconductor substrate to cross the active regions and the isolation layers with spaces interposed therebetween;
    forming charge storage layer patterns over the respective active regions within the spaces; and
    forming second insulating patterns on the isolation layers between the charge storage layer patterns within the spaces.

10. The method as claimed in claim 9, further comprising:
    forming a dielectric layer formed along surfaces of the first and second insulating patterns and the charge storage layer patterns; and
    forming a control gate pattern to cross the active regions and the isolation layers, wherein the control gate pattern overlaps the charge storage layer patterns.

11. The method as claimed in claim 9, wherein the forming of the charge storage layer patterns comprises:
    filling the spaces with a charge storage layer;
    forming mask patterns configured to block the charge storage layer on the active regions and expose the charge storage layer on the isolation layers; and
    etching the charge storage layer exposed by the mask patterns; and
    removing the mask patterns.

12. The method as claimed in claim 9, wherein the first and second insulating patterns are formed of an insulating material having a higher density than that of the isolation layers.

13. The method as claimed in claim 9, wherein the first and second insulating patterns are formed of a High density Plasma (HDP) oxide layer or a TetraEthyl OrthoSilicate (TEOS) oxide layer.

14. The method as claimed in claim 9, wherein the isolation layers are formed of a Spin on Dielectric (SOD) layer.

15. The method as claimed in claim 9, further comprising etching the first and second insulating patterns in such a manner that heights of the first and second insulating patterns are less than those of the charge storage layer patterns after the forming of the second insulating pattern.

16. The method as claimed in claim 10, further comprising forming the dielectric layer with oxide and nitride.

17. The method as claimed in claim 10, further comprising forming the control gate pattern with silicon, metal, and metal silicide.

\* \* \* \* \*